(12) United States Patent
Baek

(10) Patent No.: US 6,686,289 B2
(45) Date of Patent: Feb. 3, 2004

(54) METHOD FOR MINIMIZING VARIATION IN ETCH RATE OF SEMICONDUCTOR WAFER CAUSED BY VARIATION IN MASK PATTERN DENSITY

(75) Inventor: Kye Hyun Baek, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 54 days.

(21) Appl. No.: 10/040,490

(22) Filed: Jan. 9, 2002

(65) Prior Publication Data

US 2003/0013308 A1 Jan. 16, 2003

(30) Foreign Application Priority Data

Jun. 9, 2001 (KR) ..................................... P 2001-32310

(51) Int. Cl.⁷ ............................................ H01L 21/302
(52) U.S. Cl. ....................................... 438/706; 438/720
(58) Field of Search .................................. 438/706, 710, 438/717, 719, 729, 720

(56) References Cited

U.S. PATENT DOCUMENTS

| | | | |
|---|---|---|---|
| 4,784,719 A | * 11/1988 | Schutz | ........................ 438/695 |
| 4,786,361 A | * 11/1988 | Sekine et al. | ................. 216/37 |
| 5,514,247 A | 5/1996 | Shan et al. | |
| 5,552,996 A | * 9/1996 | Hoffman et al. | ............ 700/121 |
| 5,667,630 A | * 9/1997 | Lo | ............................... 438/653 |
| 5,877,032 A | * 3/1999 | Guinn et al. | .................... 438/9 |
| 6,043,001 A | 3/2000 | Hirsh et al. | |
| 6,054,391 A | 4/2000 | Nam et al. | |
| 6,165,907 A | * 12/2000 | Yoneda et al. | .............. 438/706 |
| 6,372,655 B2 | * 4/2002 | Khan et al. | ................. 438/714 |

\* cited by examiner

*Primary Examiner*—Kin-Chan Chen
(74) *Attorney, Agent, or Firm*—Morgan, Lewis & Bockius LLP

(57) ABSTRACT

In a method for minimizing a variation in an etch rate of a semiconductor wafer caused by a variation in a mask pattern density, the method includes determining a reference amount of an etch gas for a reference mask pattern density, obtaining an optimized amount of the etch gas for a mask pattern density different from the reference mask pattern density, wherein the optimized amount is obtained by the following equation:

$$\frac{(\text{the reference amount for the reference mask pattern density}) \times (1 - \text{the mask pattern density})}{(1 - \text{the reference mask pattern density})},$$

and the mask pattern density is a value of dividing a mask pattern area by an overall semiconductor wafer area, and applying the optimized amount of the etch gas in an etching process of the semiconductor wafer.

13 Claims, 4 Drawing Sheets

METHOD FOR MINIMIZING VARIATION IN ETCH RATE OF SEMICONDUCTOR WAFER CAUSED BY VARIATION IN MASK PATTERN DENSITY

This application claims the benefit of Korean Application No. P2001-32310 filed on Jun. 9, 2001, which is hereby incorporated by reference.

BACKGROUND OF THE INVENTION

1. Field of the Invention

The present invention relates to a semiconductor device, and more particularly, to a method for minimizing a variation in an etch rate of a semiconductor wafer caused by a variation in a mask pattern density.

2. Discussion of the Related Art

Generally, to manufacture a semiconductor device, various processes such as a deposition process and an etching process are performed on a semiconductor wafer.

The etching process is performed in such a manner that a photoresist is deposited on the semiconductor wafer and then selectively removed from the semiconductor wafer using a reticle having a pattern. Thereafter, the semiconductor wafer is chemically etched or is etched by using a plasma so as to form a pattern.

Plasma etching equipment for processing a semiconductor wafer will be described with reference to FIG. 1.

As shown in FIG. 1, a vacuum tight chamber 1 has a wafer stage 2, a gas spray plate 3, a coil 4, a gas feeding line 5, a bias power 6, and a source power 7. More specifically, at the bottom of the chamber 1, a semiconductor wafer A1 is mounted on the wafer stage 2. The bias power 6 is applied to the wafer stage 2. At the upper portion of the chamber 1, the gas spray plate is supplied with a gas through the gas feeding line 5 and a coil 4 is applied by a source power 7.

In the aforementioned plasma etching equipment for etching a semiconductor wafer, the semiconductor wafer A1 is mounted on the wafer stage 2 within the chamber 1. A gas is supplied through the gas spray plate 3. The source power 7 providing a high voltage and the bias power 6 are applied to the coil 4 and the wafer stage 2, respectively. Also, the gas supplied through the gas spray plate 3 forms a plasma having high oxidizing power within the chamber.

The semiconductor wafer A1 is etched through the following processes; inserting the semiconductor wafer A1 into the plasma etching equipment, supplying an etch gas and generating a plasma, diffusion and adsorption of the etch gas onto the semiconductor wafer W1, diffusion into the semiconductor wafer A1, reaction with the semiconductor wafer A1 and desorption of by-products, and removal of the desorpted by-products.

Recently, in order to increase an etch rate and facilitate the control of an etching process a method for lowering an overall pressure of an etch gas and increasing a density of the plasma has been widely used.

Meanwhile, in the etching process using the plasma, an etch rate is varied with a variation of a mask pattern density.

Table 1 is a graph showing a variation in the etch rate of aluminum (Al) and photoresist (PR) according to the mask pattern density under the same conditions for 0.25 μm technology logic devices using the standard parameters; process pressure of 180 mT/system power of 500 Ws/50 G/BCl₃ flow rate of 60 sccm/Cl₂ flow rate of 40 sccm/N₂ flow rate of 40 sccm.

TABLE 1

| Products | Metal 1 | Metal 2 | Metal 3 | Metal 4 | Metal 5 |
| --- | --- | --- | --- | --- | --- |
| A | 30.4% | 30.8% | 31.3% | 25.8% | 25.7% |
| B | 29.2% | 30.4% | 36.3% | 20.6% | 18.9% |
| C | 40.6% | 56.5% | | | |
| D | 40.3% | 32.7% | 49.6% | | |
| E | 24.2% | 23.9% | 30.1% | 28.3% | 27.2% |

According to the results of Table 1 and FIG. 2, since the etch rate is varied with a change in the mask pattern density for each product, an etch characteristic for each product is varied. Therefore, it is necessary to develop the same process for each product even if products of the same 0.25 μm technology grade are developed.

SUMMARY OF THE INVENTION

Accordingly, the present invention is directed to a method for minimizing a variation in an etch rate of a semiconductor wafer caused by a variation in a mask pattern density that substantially obviates one or more of problems due to limitations and disadvantages of the related art.

Another object of the present invention is to provide a method for minimizing a variation in an etch rate of a semiconductor wafer caused by a variation in a mask pattern density in which a parameter closely related to an amount of an etch gas is adjusted to reduce an effect of the mask pattern density.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a method for minimizing a variation in an etch rate of a semiconductor wafer caused by a variation in a mask pattern density, the method including determining a reference amount of an etch gas in a reference mask pattern density, obtaining an optimized amount of the etch gas in a mask pattern density different from the reference mask pattern density, wherein the optimized amount is obtained by the following equation:

$$\frac{(\text{the reference amount for the reference mask pattern density}) \times (1 - \text{the mask pattern density})}{(1 - \text{the reference mask pattern density})},$$

and the mask pattern density is a value of dividing a mask pattern area by an overall semiconductor wafer area, and applying the optimized amount of the etch gas for an etching process of the semiconductor wafer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.

In the drawings.

DETAILED DESCRIPTION OF THE ILLUSTRATED EMBODIMENTS

Reference will now be made in detail to the illustrated embodiments of the present invention, examples of which are illustrated in the accompanying drawings. Wherever possible, the same reference numbers will be used throughout the drawings to refer to the same or like parts.

Figure 1:
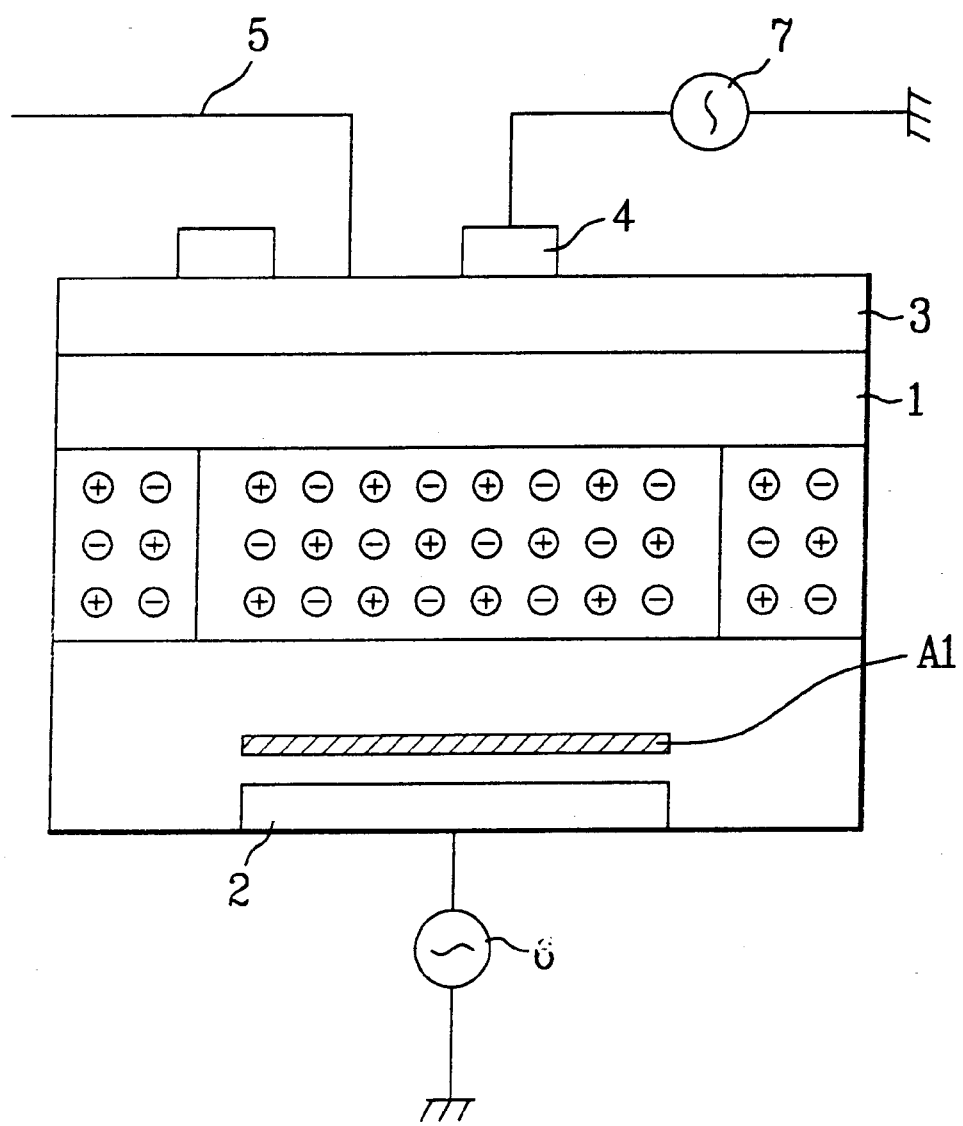
FIG. 1 is a schematic view illustrating typical plasma etching equipment for processing a semiconductor wafer.
Figure 2:
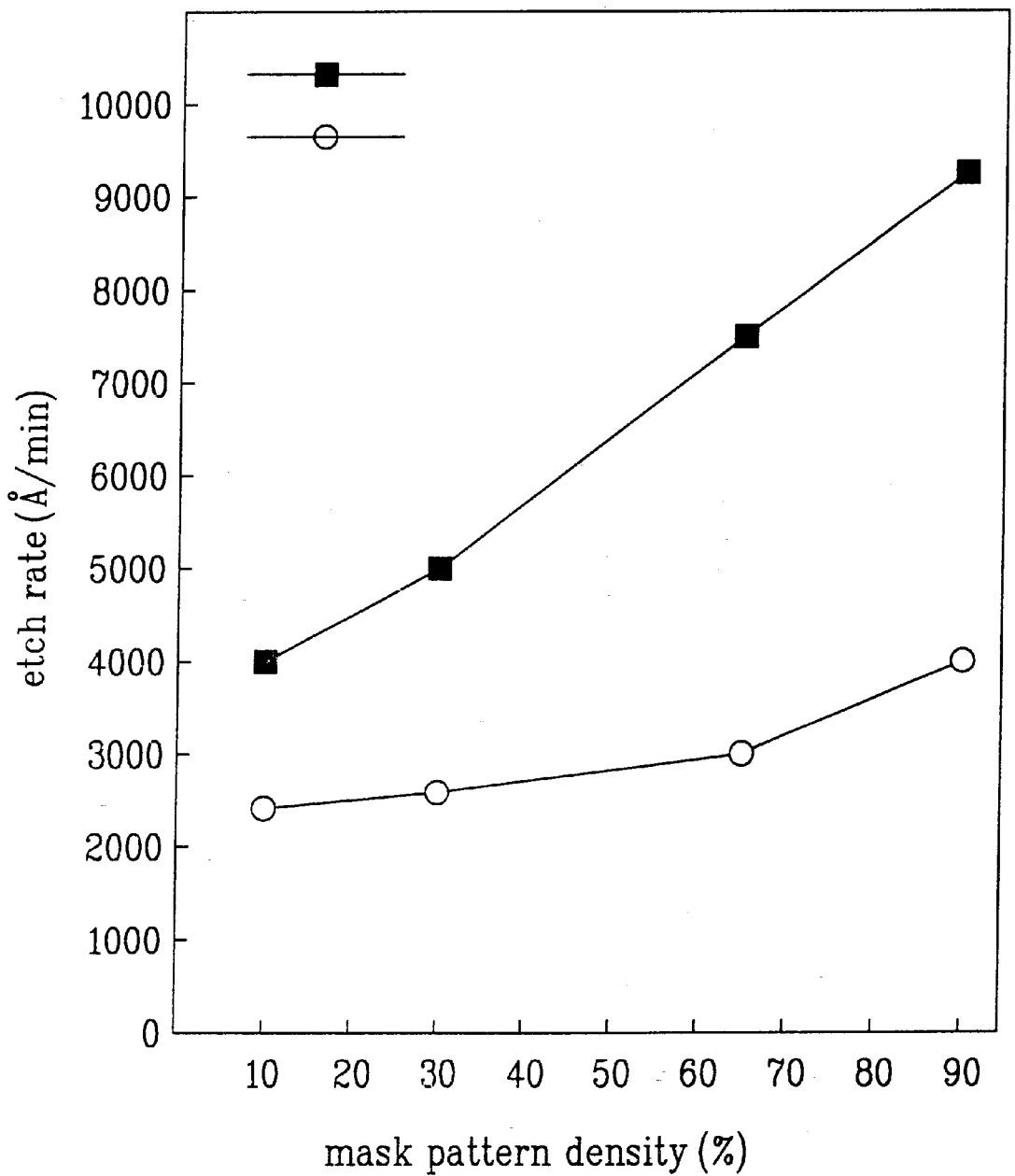
FIG. 2 is a graph illustrating a variation in etch rates of aluminum and photoresist according to a mask pattern density under the same conditions.

As shown in FIG. 2, etch rates of aluminum (Al) and photoresist (PR) are linearly increased with a mask pattern density. The mask pattern density is defined by a value obtained by dividing an area of a pattern by an overall substrate area. If the mask pattern density is low, an area to be etched increases, so that a required amount of an etch gas increases. By contrast, if the mask pattern density is high, an area to be etched is reduced, so that a required amount of an etch gas is reduced.

A required amount of an etch gas is closely related to an etch rate. It is also noted from the linear relationship shown in FIG. 2 that the required amount of the etch gas is linearly varied with the mask pattern density. A dark square represents data for aluminum while an open circle represents data for photoresist in FIG. 2.

Accordingly, if an area to be etched increases, the amount of the etch gas can be increased within the range that does not affect the process. Thus, a variation in the etch rates of aluminum (Al) and photoresist (PR) with the mask pattern density can be minimized.

In the present invention, it is intended that a variation in the etch rates of Al and PR according to a variation of the mask pattern density is minimized.

For example, for the maximum mask pattern density of about 30%, a feeding gas flow rate is increased by about 15% when the mask pattern density is about 15%. A feeding gas flow rate is decreased by about 35% when the mask pattern density is about 65%. By doing so, the variation in the etch rate of Al and PR with the mask pattern density can be reduced.

In the present invention, parameters such as a chamber pressure or etch gas flow rates are adjusted to control the amount of the etch gas. The chamber pressure affects the amount of an etch gas and etch by-products within the chamber. Gas flow rates of the etch gases are closely related to a required amount of the etch gases.

Also, since the flow rates of the etch gases are closely related to the etching process, each flow rate is selected for each process.

Considering the standard parameters in 0.25 μm technology, etch conditions for minimizing the mask pattern density effect will be described with reference to FIG. 3.

Figure 3:
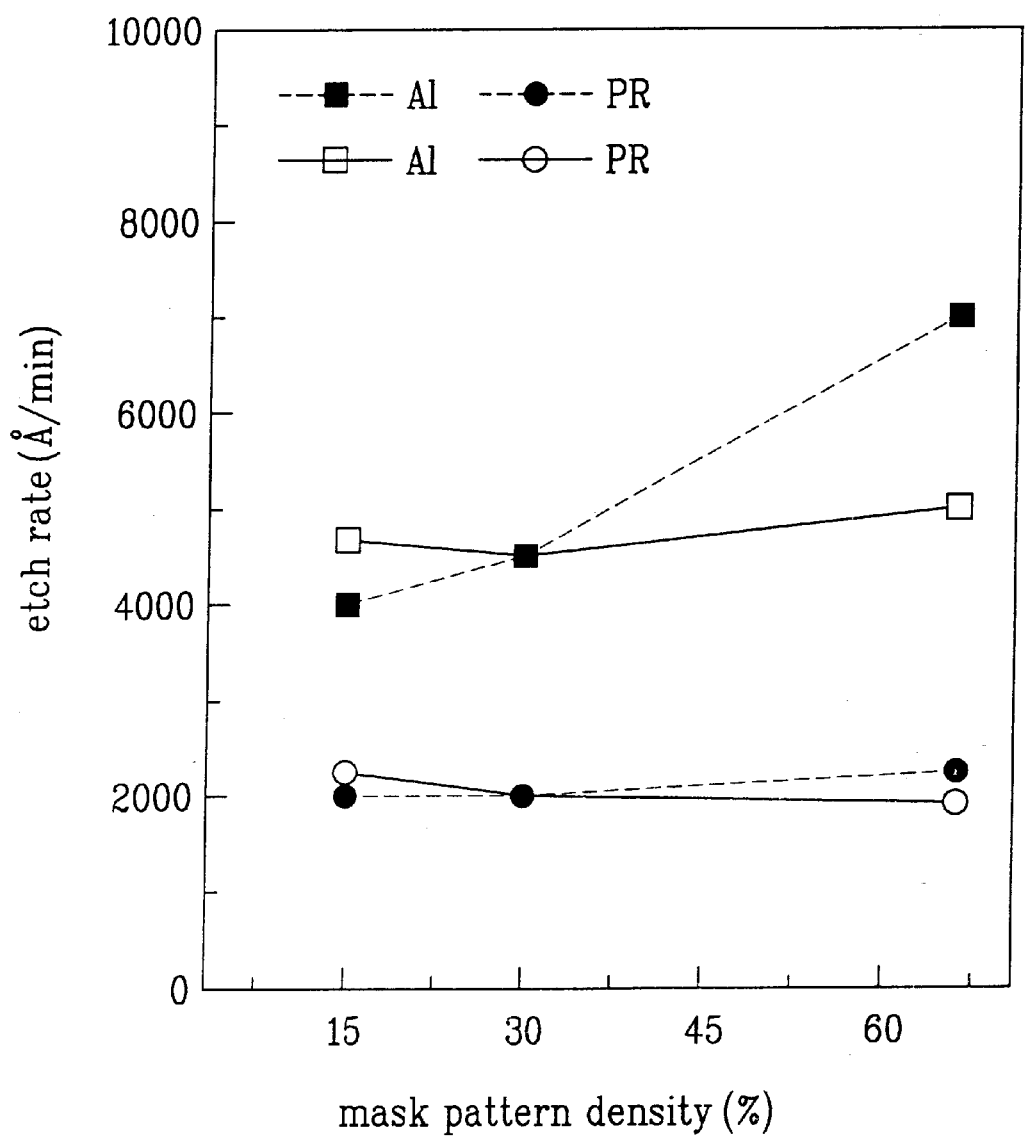
FIG. 3 is a graph illustrating a variation in etch rates of aluminum and photoresist according to a mask pattern density in accordance with the present invention.

FIG. 3 is a graph illustrating a variation in etch rates (Å/min) of Al and PR with the mask pattern density (%) in accordance with the present invention.

In FIG. 3, dotted lines represent data where the etch rates are linearly changed with an increase in the mask pattern density using the standard parameters for 0.25 μm technology. Solid lines represent data where pressure and gas flow rates are adjusted with respect to the variation of the mask pattern density in the present invention.

For example, when the mask pattern density is about 30% and the etching process is performed under the conditions, such as a process pressure of 180 mT/a system power of 500 Ws/50 G/a $BCl_3$ flow rate of 60 sccm/a $Cl_2$ flow rate of 40 sccm/a $N_2$ flow rate of 40 sccm, an area to be etched is increased if the mask pattern density is lowered to about 15%. For this reason, a pressure and an amount of etch gas are increased.

In other words, when the mask pattern density is about 15%, the etching process is performed under the conditions, such as a process pressure of 207 mT/a system power of 500 Ws/50 G/a $BCl_3$ flow rate of 69 sccm/a $Cl_2$ flow rate of 46 sccm/a $N_2$ flow rate of 46 sccm.

Meanwhile, when the mask pattern density is about 65%, the etching process is performed under the conditions, such as a process pressure of 117 mT/a system power of 500 Ws/50 G/a $BCl_3$ flow rate of 39 sccm/a $Cl_2$ flow rate of 26 sccm/a $N_2$ flow rate of 26 sccm.

More specifically, the etching process is performed in such a manner that when the mask pattern density is about 30%, the chamber pressure is 180 mT, when the mask pattern density is about 15%, the chamber pressure is 207 mT, which is increased by about 15%. When the mask pattern density is about 65%, the chamber pressure is 117 mT, which is decreased by about 35%.

Similarly, etch gases of 60 sccm $BCl_3$/40 sccm $Cl_2$/40 sccm $N_2$ are used when the mask pattern density is about 30%. The amount of etch gases of 69 sccm $BCl_3$/46 sccm $Cl_2$/46 sccm $N_2$ is increased by about 15% when the mask pattern density is about 15%. The amount of etch gases of 39 sccm $BCl_3$/26 sccm $Cl_2$/26 sccm $N_2$ is decreased by about 35% when the mask pattern density is about 65%.

Meanwhile, each etch gas rate is maintained unchanged.

In FIG. 3, it is noted that an etch rate of Al and PR is almost unchanged even if the mask pattern density is changed.

Figure 4A:
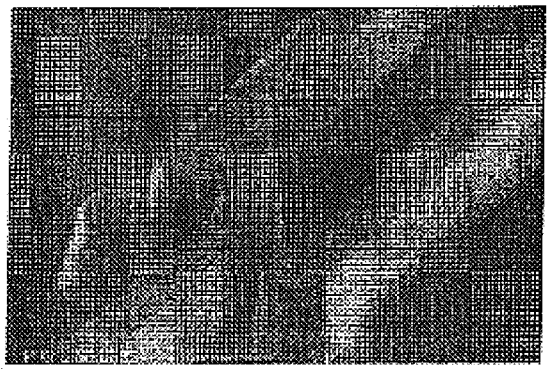
FIGS. 4A to 4C show etching profiles when the same etching conditions are used according to a mask pattern density and when conditions of the present invention are used.
Figure 4B:
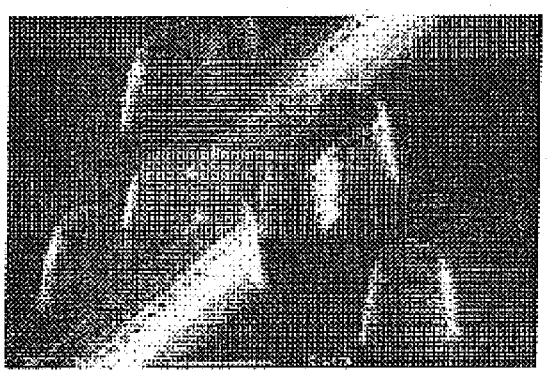
Figure 4C:
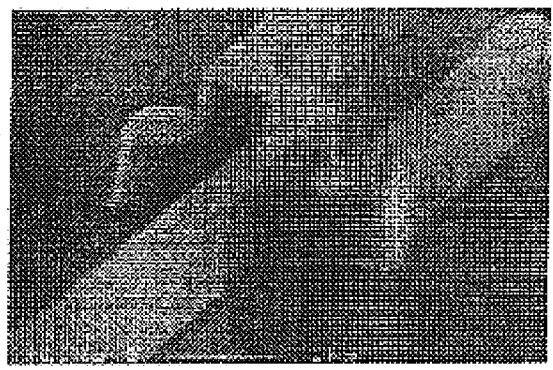

FIGS. 4A and 4B show etching profiles when the same etching conditions are used without considering a variation in a mask pattern density and FIG. 4C is an etching profile when obtained by adjusting a process pressure and an etch gas flow rate in the present invention. It is noted in the present invention that an etching process can be controlled regardless of the mask pattern density. As shown in FIGS. 4A and 4B, the etching profiles are defective due to an inconsistent etching.

More specifically, FIG. 4A shows an etching profile for the mask pattern density of about 30%, while FIG. 4B shows an etching profile for the mask pattern density of about 15% without adjusting other parameters. FIG. 4C shows an etching profile obtained by increasing a pressure and a flow rate for the etch gas in the present invention by about 15% for the mask pattern density of about 15%.

Table 2 numerically and theoretically illustrates a method for optimizing a process pressure and a gas flow rate of the etch gas with respect to the variation in the mask pattern density in the present invention.

TABLE 2

| Mask pattern density (region to be etched) | Process pressure/ etch gas flow rate in the related art | Process pressure/ etch gas flow rate in the present invention |
| --- | --- | --- |
| 15.2% (84.8%) | 212 mT/165 sccm | 219 mT/171 sccm |
| 30.4% (69.6%) | 259 mT/201 sccm | 180 mT/140 sccm |
| 65.2% (34.8%) | 517 mT/402 sccm | 90 mT/70 sccm |

Generally, a process pressure and a flow rate considering a variation in the mask pattern density are determined by a value obtained by dividing an applied pressure and a flow rate by a region to be etched. The optimized process pressure and the flow rate are pressure of 180 mT and flow rate of 140 sccm when the mask pattern density is about 30%.

The process pressure and flow rate in the related art considering a variation in the mask pattern density are determined as 212 mT/165 sccm when the mask pattern density is about 15%, and 517 mT/402 sccm when the mask pattern density is about 65%, respectively. These values are different from the optimized process pressure and flow rate, which are obtained when the mask pattern density is about 30%. Thus, the values should be adjusted for the optimum values.

Therefore, in the present invention, the applied pressure depending on the mask pattern density has been obtained by dividing a reference value region to be etched (0.696) by 180 mT×region to be etched. An etch gas flow rate has been obtained by dividing a reference value region to be etched (0.696) by 140 sccm×region to be etched.

As a result, when the mask pattern density is about 15%, the process pressure is 259 mT obtained by dividing 219 mT (applied pressure) by 0.848 while the flow rate is 201 sccm obtained by dividing 171 sccm (applied flow rate) by 0.848. These results show that the process pressure and the flow rate can be obtained and are close to the optimized pressure of 259 mT and flow rate of 201 sccm when the mask pattern density is about 30%.

As described above, the method for minimizing a variation in an etch rate of a semiconductor wafer caused by a variation in a mask pattern density according to the present invention has the following advantages.

An effect of the mask pattern density for each product is minimized in the etching process. Also, financial loss, material loss, and personal loss that may be caused by adjusting the process for each product are reduced. Furthermore, a schedule for developing a new product is shortened by practicing the present invention.

It will be apparent to those skilled in the art that various modifications and variations can be made in the method for minimizing a variation in an etch rate of a semiconductor wafer caused by a variation in a mask pattern density of the present invention without departing from the spirit or scope of the inventions. Thus, it is intended that the present invention covers the modifications and variations of this invention provided they come within the scope of the appended claims and their equivalents.

What is claimed is:

1. A method for minimizing a variation in an etch rate of a semiconductor wafer caused by a variation in a mask pattern density, the method comprising:

determining a reference amount of an etch gas according to a reference mask pattern density;

obtaining an optimized amount of the etch gas according to a mask pattern density different from the reference mask pattern density, wherein the optimized amount is obtained by the following equation:

$$\frac{(\text{the reference amount according to the reference mask pattern density}) \times (1 - \text{the mask pattern density})}{(1 - \text{the reference mask pattern density})},$$

and the mask pattern density is a value of dividing a mask pattern area by an overall semiconductor wafer area; and applying the optimized amount of the etch gas in an etching process of the semiconductor wafer.

2. The method of claim 1, wherein the optimized amount of the etch gas is controlled by varying a chamber pressure and an etch gas flow rate.

3. The method of claim 2, wherein a total amount of etch by-products is controlled by varying the chamber pressure.

4. The method of claim 2, wherein the etching process is performed in such a manner that the chamber pressure is 180 mT when a layer to be etched is Al and the reference mask pattern density is about 30%.

5. The method of claim 2, wherein an etch gas flow is constant.

6. The method of claim 2, wherein the etch gas flow is 60 sccm $BCl_3$/40 sccm $Cl_2$/40 sccm $N_2$ when the reference mask pattern density is about 30%.

7. The method of claim 2, wherein the etch gas flow is 69 sccm $BCl_3$/46 sccm $Cl_2$/46 sccm $N_2$ when the mask pattern density is about 15%.

8. The method of claim 2, wherein the etch gas flow is 39 sccm $BCl_3$/26 sccm $Cl_2$/26 sccm $N_2$ when the mask pattern is about 65%.

9. The method of claim 2, wherein the chamber pressure is about 219 mT when the mask pattern density is about 15%.

10. The method of claim 2, wherein the chamber pressure is about 90 mT when the mask pattern density is about 65%.

11. The method of claim 1, wherein the etching process is performed using a plasma.

12. The method of claim 1, wherein the mask pattern density is obtained for each unit of wafer in each etching process.

13. The method of claim 1, wherein the etching process is carried out by using a power of 500 Ws/50 G.

* * * * *